United States Patent
Lee et al.

(10) Patent No.: US 8,529,795 B2
(45) Date of Patent: Sep. 10, 2013

(54) WET-PROCESSIBLE METAL OXIDE SOLUTION, METHOD OF USING THE SAME, AND ORGANIC PHOTOVOLTAIC CELL OF USING THE SAME

(75) Inventors: Kwang-Hee Lee, Gwangju (KR); Jin-Young Kim, Gwangju (KR); Sung-Heum Park, Gwangju (KR)

(73) Assignee: Gwangju Institute of Science and Technology, Gwangju (KR)

(*) Notice: Subject to any disclaimer, the term of this patent is extended or adjusted under 35 U.S.C. 154(b) by 525 days.

(21) Appl. No.: 12/674,554

(22) PCT Filed: Aug. 22, 2008

(86) PCT No.: PCT/KR2008/004909
§ 371 (c)(1),
(2), (4) Date: May 17, 2010

(87) PCT Pub. No.: WO2009/025523
PCT Pub. Date: Feb. 26, 2009

(65) Prior Publication Data
US 2011/0168249 A1    Jul. 14, 2011

(30) Foreign Application Priority Data

Aug. 22, 2007 (KR) .................. 10-2007-0084234

(51) Int. Cl.
*H01B 1/00* (2006.01)
(52) U.S. Cl.
USPC ........... 252/500; 252/194; 136/256; 264/225; 423/338; 423/610
(58) Field of Classification Search
USPC ......... 252/500, 194; 423/338, 610; 136/256; 264/225
See application file for complete search history.

(56) References Cited

U.S. PATENT DOCUMENTS

| | | | | |
|---|---|---|---|---|
| 4,619,908 A | * | 10/1986 | Cheng et al. | 502/214 |
| 5,168,024 A | * | 12/1992 | Yamamoto et al. | 430/58.2 |
| 5,409,683 A | * | 4/1995 | Tillotson et al. | 423/338 |

FOREIGN PATENT DOCUMENTS

| | | |
|---|---|---|
| EP | 1164207 A2 * | 12/2001 |
| JP | 2003-252626 A | 9/2003 |
| KR | 10 20000071869 A | 11/2000 |
| KR | 1020010096478 A | 11/2001 |
| KR | 1020040068027 A | 7/2004 |
| KR | 1020070047089 A | 5/2007 |
| WO | 2004/087318 A1 | 10/2004 |

OTHER PUBLICATIONS

Office Action issued in Korean Application No. 10/2008-0082205 dated Apr. 12, 2010 (6 pages).

(Continued)

*Primary Examiner* — Khanh Tuan Nguyen
(74) *Attorney, Agent, or Firm* — Osha Liang LLP

(57) ABSTRACT

A method of preparing a wet-processible metal oxide solution and a method of fabricating a film using the same are provided. A metal oxide that has been widely used as a photocatalyst is improved and a metal oxide solution having new functionality is formed. The metal oxide solution is transparent, wet-processible, and facilitates electron transfer. The metal oxide solution can be applied in various ways to an electronic device and is well-suited for application to an electronic device using organic materials. Also, a titanium oxide solution functions to remove and block oxygen and moisture. Thus, when it is applied to an electronic device using organic materials that are vulnerable to oxygen and moisture, the lifetime of the device can be increased.

18 Claims, 8 Drawing Sheets

(56) References Cited

OTHER PUBLICATIONS

Extended European Search Report issued in European Application Applicaiton No. 08793421.2 dated Jul. 2, 2010 (6 pages).
Patent Abstacts of Japan, Pulication No. 2003-252626, dated Sep. 10, 2003 (1 page).
Written Opinion from PCT/KR2008/004909 Dated: Feb. 17, 2009 (6 pages).
International Search Report from PCT/KR2008/004909 dated Feb. 17, 2009 (3 pages).
Korean Patent Abstracts; Publication No. 1020040068027 dated Jul. 30, 2004 (1 page).
Korean Patent Abstracts; Publication No. 1020010096478 dated Nov. 7, 2001 (1 page).
Korean Patent Abstracts; Publication No. 1020000071869 dated Nov. 25, 2000 (1 page).
Korean Patent Abstracts; Publication No. 1020070047089 dated May 4, 2007 (1 page).

* cited by examiner

HYDROPHOBIC POLYMER

WET-PROCESSIBLE METAL OXIDE SOLUTION, METHOD OF USING THE SAME, AND ORGANIC PHOTOVOLTAIC CELL OF USING THE SAME

TECHNICAL FIELD

The present invention relates to a metal oxide solution and a method of fabricating a thin film, and more particularly, to a wet-processible metal oxide solution capable of efficiently blocking air and moisture, and an organic photovoltaic cell having a thin film.

BACKGROUND ART

Electro-optical devices using organic materials have been drawing an increasing amount of attention as next generation devices due to their numerous advantages. In particular, a polymer electronic device using a polymer as an active layer can be easily and economically fabricated through a wet process, can be curved, and thus may be regarded as a new electronic device. However, before commercializing the polymer electronic device, problems of low performance and short device lifetime have to be overcome.

There are two ways to improve the performance of the polymer device, one is to improve the performance of a material applied to the device, and the other is to improve the structure of the device and its fabrication method. However, it may be difficult to synthesize a new material having high performance, and while there have been various attempts to improve structure and fabrication method, no substantial progress has been made. A great deal of current research has aimed at improving device performance by introducing a material having a new function into a conventional device structure, because this enables device performance to be improved more easily and conventional fabrication techniques to be used.

Meanwhile, the polymer electronic device using the polymer as an active layer may have a short lifetime since the polymer used as the active layer is vulnerable to moisture and oxygen. When an electronic device is fabricated and driven, the performance of the device may drastically deteriorate due to the effects of moisture and oxygen on the polymer. In order to improve the performance of the device, oxygen and moisture existing in the device have to be removed during fabrication and prevented from infiltrating from outside.

In order to extend the lifetime of a device, after blocking oxygen and moisture during fabrication, oxygen and moisture should be prevented from infiltrating from the outside using an encapsulation method. However, this method may require complicated fabrication processes and high-priced equipment. Further, while oxygen and moisture may be efficiently prevented from infiltrating from outside, oxygen and moisture that has already infiltrated can not be easily removed during fabrication. Thus, the method is ineffective at extending the lifetime of the device. Accordingly, there is a need to develop new technology capable of easily blocking oxygen and moisture at low cost and removing oxygen and moisture already present to extend the lifetime of a device.

Titanium oxide is a representative metal oxide photocatalyst that is used to remove indoor moisture and disinfect through a photodegradation function. The photocatalyst functions to remove moisture and decompose organic materials through absorption of light, and in particular, the titanium oxide has high electron mobility. This fact suggests that when titanium oxide is appropriately modified to perform new functions, it may be applied to a polymer electronic device. That is, when advantages of titanium oxide are exploited to remove oxygen and moisture and facilitate electron transfer, and its characteristics are changed to apply to a polymer electronic device, the polymer electronic device's problems of poor performance and short lifetime may be overcome.

However, all metal oxide photocatalysts developed thus far, including titanium oxide, are hydrolyzed and gelated so that they are opaque when fabricated, or they take the form of powder. This makes it difficult to fabricate a film using them. Moreover, since a sintering process is performed at a high temperature, it is difficult to apply to a heat-sensitive polymer electronic device. Therefore, there is need of a new material that is capable of overcoming the above problems and facilitating electron transfer and moisture removing effect of titanium oxide, and that can be applied by coating and does not require separate thermal treatment.

DISCLOSURE OF INVENTION

Technical Problem

The present invention is directed to a method of preparing a metal oxide solution in which moisture removing ability, electron transport ability and transparency are maintained, a wet process can be performed, and high-temperature thermal treatment is not required.

The present invention is also directed to a metal oxide solution provided by the method.

The present invention is further directed to an organic photovoltaic cell using the metal oxide solution.

Technical Solution

One aspect of the present invention provides a method including: introducing a solvent and an additive into a metal alkoxide, and forming a metal oxide intermediate solution; applying heat to the metal oxide intermediate solution, concentrating the metal oxide intermediate solution, and forming a gelatinous metal oxide; and mixing the metal oxide with a dispersion solution, and forming a metal oxide solution.

Another aspect of the present invention provides a metal oxide solution including: a solvent that is evaporated in a process of concentration; a metal alkoxide mixed at a volume of 5% to 60% with respect to the solvent prior to the concentration process; an additive mixed at a volume ratio of 5% to 20% with respect to the solvent; and a dispersion solution for diluting a gelatinous metal oxide formed by the concentration process.

Still another aspect of the present invention provides an organic photovoltaic cell including: a substrate having a positive electrode; a photoactive layer formed on the substrate; a metal oxide formed on the photoactive layer; and a negative electrode formed on the metal oxide, wherein the metal oxide is formed by coating and drying a metal oxide solution. The metal oxide solution includes a solvent evaporated in a process of concentration, a metal alkoxide mixed at a volume ratio of 5% to 60% with respect to a solvent prior to the concentration, an additive mixed at a volume ratio of 5% to 20% with respect to the solvent, and a dispersion solution for diluting a gelatinous metal oxide formed in the process of concentration.

Advantageous Effects

According to the present invention, a metal oxide can be easily applied through a solution process. Also, since a metal oxide solution is formed in a state where oxygen and moisture are removed, gelation is prevented. Also, in the process of forming a film, the metal oxide is gelated, oxygen and moisture existing on a lower film are absorbed, and thus the lifetime of a device can be increased. Furthermore, removal of oxygen and moisture enables the lifetime of a device to be extended, and a metal oxide that is formed in an amorphous structure in the process of gelation by absorbing moisture can efficiently prevent external oxygen and moisture. In addition, since a metal oxide solution provided by the present invention exhibits amphiphilic properties, a thin film that possesses both hydrophilic and hydrophobic properties can be formed.

MODE FOR THE INVENTION

Figure 1:
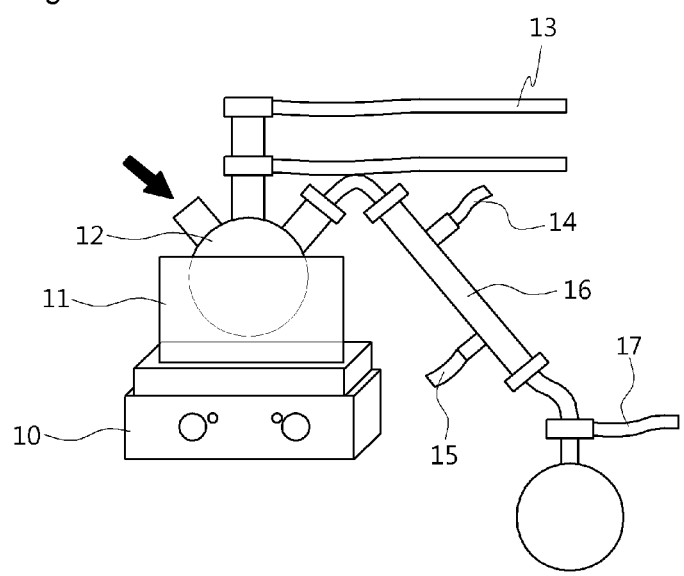
FIG. 1 schematically illustrates a device for preparing a titanium oxide solution.

The present invention will be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals designate like elements throughout the specification.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the accompanying drawings.

Example Embodiment 1

In order for titanium oxide to be applied to a polymer, the following characteristics and functions are required.

First, in order to prevent loss of light incident on a device or generated in the device due to absorption by titanium oxide itself, the titanium oxide must not absorb light of visible wavelengths.

Second, a device must be easy to fabricate, which is an advantage of a polymer electronic device, and it must be possible to easily apply a wet process in fabricating a device.

Third, taking into account characteristics of a polymer that readily deteriorates at high temperatures, there must be no need for high-temperature thermal treatment when the process is applied to a polymer electronic device.

Fourth, in order to enable an externally injected or internally generated electron to be transferred, high electron mobility is required.

In the present invention, a metal oxide solution satisfying the above four conditions is provided, and technology to which the solution is applied is disclosed. That is, metal oxide solutions used as a conventional photocatalyst are disclosed, and in particular, a method of preparing a titanium oxide solution is disclosed.

Main features of the inventive metal oxide solution having a new function are described below.

First, a conventional metal oxide having a net structure formed through hydrolysis is generally opaque, and it is difficult to perform a wet process on the metal oxide. However, in the present invention, since hydrolysis does not occur in the solution state before a thin film is formed, a net structure is not formed. Therefore, a wet process may be performed on a metal oxide precursor in which a solvent is mixed with an additive, and the metal oxide precursor is transparent.

Second, even if a metal oxide is not generated through a sintering process at a high temperature, hydrolysis and gelation processes in fabrication of the metal oxide may sufficiently remove moisture by reaction of oxygen or moisture.

Third, even if a metal oxide is in an amorphous state prior to a sintering process, its charge mobility is comparatively high. That is, when a metal oxide is prepared, moisture is intentionally removed, a hydrolysis reaction is prevented, and a dispersant is added, so that gelation is delayed. As a result, a liquid process is possible using a transparent metal oxide solution that is in a liquid state. Also, it may be used as an electron transport layer due to high electron mobility. Moreover, the solution according to the present invention reacts with moisture in the air after a film is formed, causing hydrolysis to occur. Also, since gelation is carried out, moisture and oxygen in a device may be removed. In addition, even after completion of the gelation, the coated metal oxide layer has high density, so that it can efficiently prevent oxygen and moisture from infiltrating from outside. Therefore, performance and lifespan of a device can be improved.

According to the technical features of the present invention, when the metal oxide is prepared, contact with moisture is intentionally prevented, and gelation is delayed by the addition of a dispersion solution. In the conventional art, when a metal oxide is prepared, moisture is added in a natural way causing hydrolysis to occur, and gelation causes a net structure to be obtained. However, in the present invention, gelation is prevented so that a film is formed in a solution state.

The inventive method of preparing a metal oxide used as a photocatalyst has the following differences from a conventional method.

First, in the present invention, when a metal oxide solution is prepared, moisture is excluded. A conventional method of preparing a metal oxide for a photocatalysist includes mixing a solvent and a catalyst with a metal alkoxide, adding moisture, and inducing hydrolysis. Also, once hydrolysis is carried out, the metal oxide generates water, alcohol, vapor, etc. to form a net structure. Other ingredients excluded from the net structure are evaporated during thermal treatment. The amorphous metal oxide constituting the net structure is thermally treated to be crystallyzed. The crystallization enables anatase- or rutile-type metal powder or a diluted-type photocatalyst to be completed.

However, in the present invention, the original metal alkoxide, a solvent and an additive are mixed without adding moisture. Therefore, a hydrolysis reaction does not occur in the metal alkoxide, and the solvent is mixed with the additive.

Here, an alkoxide is a compound in which a metal is combined with an alcohol group. To avoid confusion, the terms alkoxide and metal alkoxide have the same meaning herein.

Second, in the present invention, a dispersion solution is added to control a gelation process. That is, in order to intentionally prevent gelation of a solution in which a solvent is mixed with an additive, a considerable amount of dispersion solution is added.

Third, when the metal oxide solution of the present invention is coated on a substrate to form a thin film, it comes in contact with air and moisture, and gelation is carried out through hydrolysis when the solution is coated on the substrate. That is, since hydrolysis does not occur in a solution state, after the coating for forming a film without producing a net structure, hydrolysis occurs to form the net structure.

In addition, since the metal oxide solution of the present invention is prepared by adding the metal oxide, the solvent, and the dispersion solution, a wet process may be performed thereon, and the solution retains uniform hydrophilic and hydrophobic properties. Therefore, the metal oxide solution has amphiphilic characteristics, so that a film can be formed by coating regardless of whether a material is based on an aqueous solution or an organic solvent. These characteristics may be usefully applied to a polymer electronic device that uses a material based on an aqueous solution and a material based on an organic solvent. Further, the conventional drawback of not being able to simultaneously form layers having different surface characteristics is overcome. That is, the invention may be applied to polymer devices with "a structure of an organic solution-based material/metal oxide solution/aqueous solution-based material" or device with a structure of "an aqueous solution-based material/metal oxide solution/organic solution-based material."

Similarly, when materials using the same solvent are sequentially stacked, a problem caused by dissolving an earlier coated material by a solvent of a later coated material may be overcome by changing the sequence of the stacking, e.g., "an organic solution based material/a metal oxide solution/an organic solution based material" or "an aqueous-solution based material/a metal oxide solution/an aqueous-solution based material".

The metal oxide solution is prepared by the following processes.

First, a solvent and an additive are mixed with a metal alkoxide with oxygen and moisture removed, so that a metal oxide intermediate solution is formed.

The solvent includes alcohols such as ethanol, methanol, isopropanol, etc. In addition, alcohol-amine such as ethanol-amine, methanol-amine, propanol-amine, etc., hydrogen peroxide, or ammonium hydroxide is selected as the additive. Further, the metal of the metal alkoxide may be Ti, Zn, Sr, In, Ba, K, Nb, Fe, Ta, W, Sa, Bi, Ni, Cu, Mo, Ce, Pt, Ag, Rh, Ru, or a mixture thereof.

That is, a solvent and an additive may be mixed with a metal alkoxide to form the metal oxide intermediate solution. An example of using titanium alkoxide will be described below, however any of the above-mentioned metal elements can be applied in the same way as titanium.

First, in the composition of a titanium oxide intermediate solution, the metal alkoxide is set to have a volume ratio of 5% to 60% with respect to the solvent, and the additive is set to have a volume ratio of 5% to 20% with respect to the solvent.

Then, the formed titanium oxide intermediate solution is concentrated. The concentration process includes applying heat to the titanium oxide intermediate solution to remove the solvent and facilitate combination of the additive with the titanium alkoxide. The temperature in the process of concentration is 60° C. to 180° C. The concentration causes the titanium oxide intermediate solution to be changed into a gel state so that a titanium alkoxide mixture is formed. That is, the metal alkoxide is combined with the additive in the process of concentration to form a gelatinous metal oxide.

Afterwards, a dispersion solution is added to the gelatinous titanium alkoxide. Alcohol such as isopropanol, ethanol, methanol, etc., chloroform, chlorobenzene, dichlorobenzene, tetrahydrofuran (THF), xylene, DMF, DMSO, or toluene is selected as the dispersion solution. The dispersion solution and the titanium alkoxide gel are mixed so that a titanium oxide solution of the present invention is formed. The dispersion solution may be formed to have a volume ratio of 1000% to 20000% with respect to the injected metal alkoxide.

The titanium oxide solution formed as a result of the above-described process is coated on the substrate to form a film.

That is, a first layer is formed on the substrate and the titanium oxide solution is coated on the first layer.

The substrate may be formed of glass, paper, PET, PES, PC, PI, PEN, PAR or a mixture thereof.

Also, the first layer formed on the substrate may be formed of one selected from the group consisting of polyaniline, polypyrol, polyacethylene, poly(3,4-ethylenedioxythiophene) (PEDOT), poly(phenylenevinylene) (PPV), poly(fluorene), poly(para-phenylene) (PPP), poly(alkylly-thiophene), and poly(pyridine) (PPy) and a mixture thereof.

Also, the coating process may be performed through various methods. That is, a coating process is performed using the titanium oxide solution in a liquid state using a spray or spin coating method. The titanium oxide solution reacts with the air or moisture and initiates a hydrolysis reaction. Accordingly, the titanium oxide solution is gelated, so that a titanium oxide layer is formed.

Afterwards, a second layer is formed on the gelated titanium oxide layer. The second layer may be formed of one selected from the group consisting of polyaniline, polypyrol, polyacethylene, poly(3,4-ethylenedioxythiophene) (PEDOT), poly(phenylenevinylene), (PPV), poly(fluorene), poly(para-phenylene) (PPP), poly(alkylly-thiophene) and poly(pyridine) (PPy) and a mixture thereof.

The above-described titanium oxide solution disclosed in the present invention enables a wet-process to be performed and is transparent in a visible range so that it may be applied to an optical device. In addition, since it has energy levels that combine well with an organic semiconductor, it has high electron mobility.

EXAMPLE 1

Preparation of Titanium Oxide Solution

In Example 1, a process of preparing a titanium oxide solution that can be used in a wet process will be described in detail.

FIG. 1 schematically illustrates a device for preparing a titanium oxide solution.

Referring to FIG. 1, tools were sealed using rubber stoppers to prevent oxygen and moisture from infiltrating into a flask. When sealing of the tools was completed, moisture in the flask 12 was removed by supplying nitrogen gas to the flask 12 and heating on a hot plate 10 set to a temperature of 150° C. or higher for about 2 hours. As illustrated in FIG. 1, an oil bath 11 placed on the hot plate 10 functions to heat the flask 12 uniformly.

When moisture was sufficiently removed, the temperature of the hot plate 10 was lowered to room temperature, 5 ml of titanium (IV) isopropoxide (titanium alkoxide) was gradually injected through an injection port of the flask 12, in which a magnetic stirring bar was turned, using a needle along a wall of the flask. Then, 20 ml of 2-methoxyethanol as a solvent and 2 ml of ethanolamine as an additive were injected by the same method and the contents of the flask 12 were agitated for one hour so that injected titanium isopropoxide, 2-methoxyethanol and ethanolamine were sufficiently mixed. Here, it was necessary to supply a sufficient amount of nitrogen to prevent oxygen and air from infiltrating. The nitrogen was provided through a nitrogen injection port 13 and exhausted through an exhaust port 17.

After agitating for about one hour at room temperature, the temperature of the hot plate 10 was raised to 80° C. and agitation was performed for about one hour. Then, a concentration process was performed on the resulting titanium oxide intermediate solution. Afterwards, the temperature of the hot plate 10 was raised to 120° C. and agitation was performed once again. While this process may be sufficiently completed within one hour, time and an amount of nitrogen supplied should be adjusted according to the state of the remaining titanium oxide. When the solvent evaporated as the temperature of the hot plate was raised, cooling water was injected through a cooling water injection port 15 and the evaporated solvent was cooled in a condenser 16. The cooling water was exhausted through a cooling water outlet 14.

Also, when the titanium oxide becomes a gel, its optimal state is achieved. When the titanium oxide became a gel, the temperature was lowered to room temperature again. The titanium oxide at this point generally appeared light purple.

When the titanium oxide gel was formed, a dispersion solution was injected to dilute the gelatinous titanium oxide. That is, the titanium oxide was agitated using a magnetic stirring bar and diluted by adding 10 ml of isopropanol (approximately twice titanium (IV) isopropoxide). Here, alcohols such as isopropanol, ethanol, methanol, etc., or an organic solvent such as chloroform, chlorobenzene, dichlorobenzene, THF, DMF, DMSO, toluene, etc. may be used as a finally injected dispersion solution.

In addition, when the titanium oxide solution prepared by the above-described method is applied to an electronic device, the amount of dispersion solution injected may be adjusted depending on the circumstances.

Figure 2:
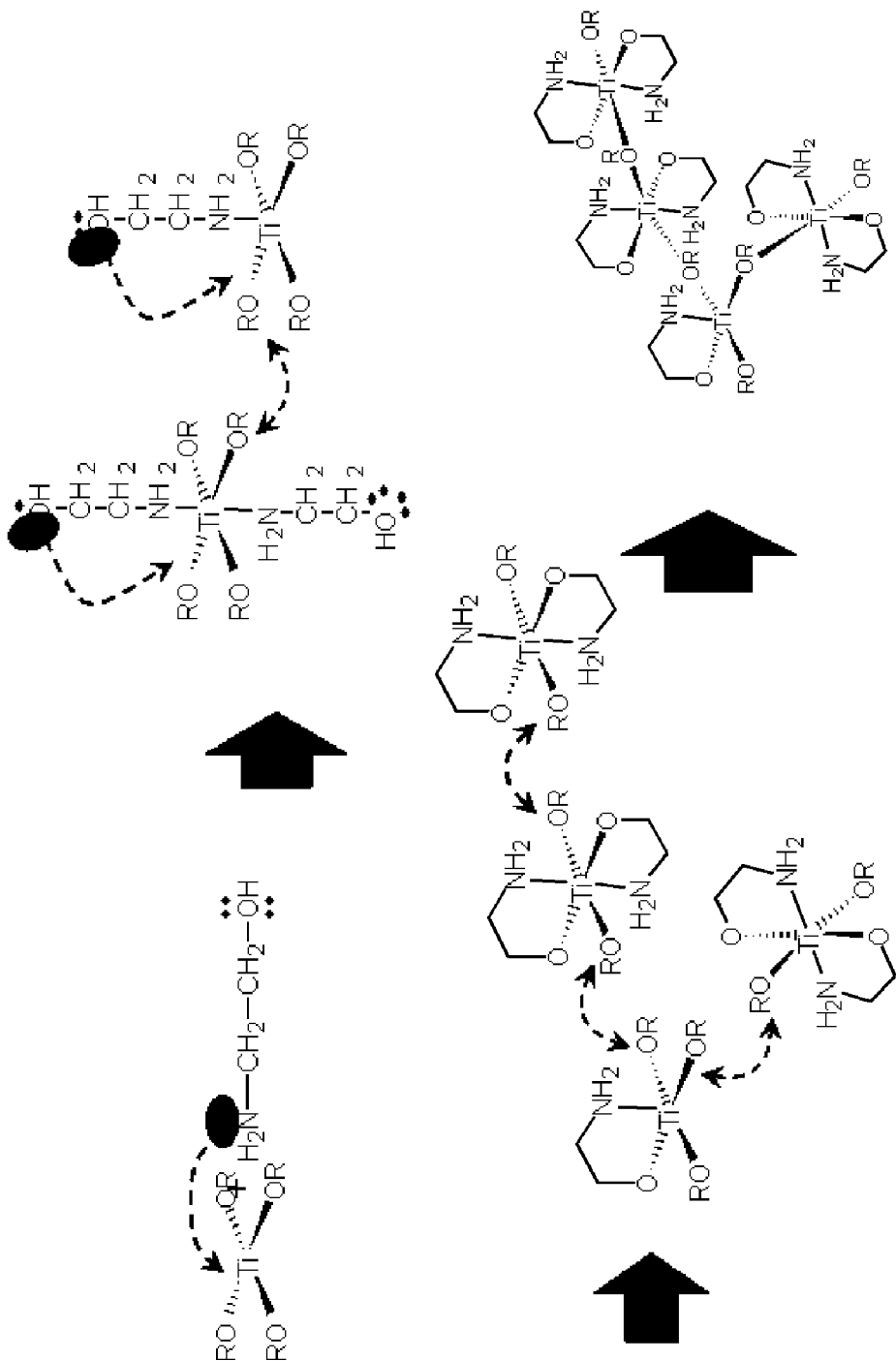
FIG. 2 illustrates a molecular structure for explaining a mechanism for forming a titanium oxide solution.

FIG. 2 illustrates a molecular structure for explaining a mechanism for forming a titanium oxide solution disclosed in the example.

Referring to FIG. 2, titanium (IV) isopropoxides are combined with each other by injecting ethanol-amine that is alkylamine as an additive and performing a concentration process on the mixed solution. A hydroxy group at an end of the additive is combined with a titanium atom to form a chain, and intermediate products having an alkyl group are combined with each other. During the combination process, adjacent intermediate products are combined between the titanium atoms.

When the titanium oxide solution prepared in Example 1 comes in contact with moisture, a hydrolysis reaction occurs, alcohols are exhausted due to the hydrolysis reaction, and the titanium oxide finally attains an amorphous state.

Evaluation of Characteristics of Titanium Oxide Solution

An absorption spectrum of the titanium oxide solution prepared in Example 1 was measured and compared.

The titanium oxide solution was spin coated on a rinsed fused silica substrate at 3000 rpm for one hour, and the substrate was placed in an oven at a temperature of 60° C. for 2 hours so that a film was formed. Afterwards, an absorption spectrum of the formed film was measured using an UV-VIS spectrometer, and the results were compared with corresponding measurements for a titanium oxide film fabricated using a conventional photocatalyst.

Figure 3:
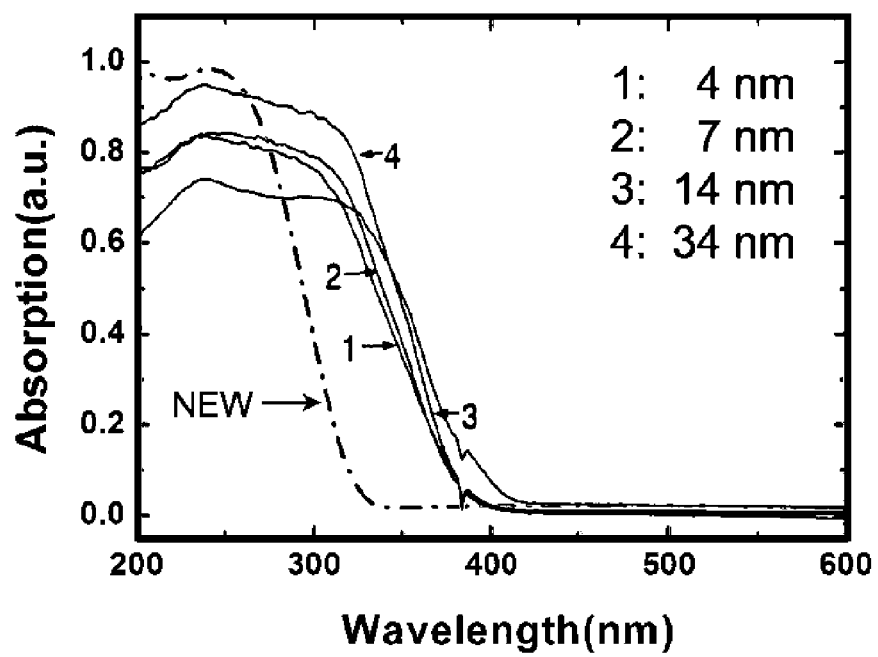
FIG. 3 is a graph illustrating an absorption spectrum of titanium oxide.

FIG. 3 illustrates absorption spectra of a titanium oxide film fabricated according to the present invention and a titanium oxide film used as a photocatalyst fabricated using a conventional method. The absorption spectrum of the titanium oxide film of the present invention is represented by a dotted line, and absorption spectra of the titanium oxide film fabricated by the conventional method are represented by 1, 2, 3 and 4.

1, 2, 3 and 4 correspond to absorption spectra of titanium oxide according to particle sizes. In FIG. 3, while absorption begins around 400 nm in the conventional titanium oxide film, it begins around 320 nm in the titanium oxide film of the present invention. This shows that the titanium oxide film of the present invention is transparent and does not absorb light of visible range.

In addition, in order to confirm charge mobility, time of flight (TOF) of the titanium oxide film was measured. In order to measure TOF, MEH-PPV, a light-emitting polymer, was spin coated on a transparent ITO electrode to form a charge generating layer having a thickness of 40 nm. In addition, a titanium oxide was spin coated on the formed charge generating layer to form a film having a thickness of 500 nm. Then, aluminum was deposited on the titanium oxide film.

An electrode was connected to the formed sample, a pulse laser of 377 nm wavelength was incident on the connected structure, and TOF was observed through an oscilloscope.

Figure 4:
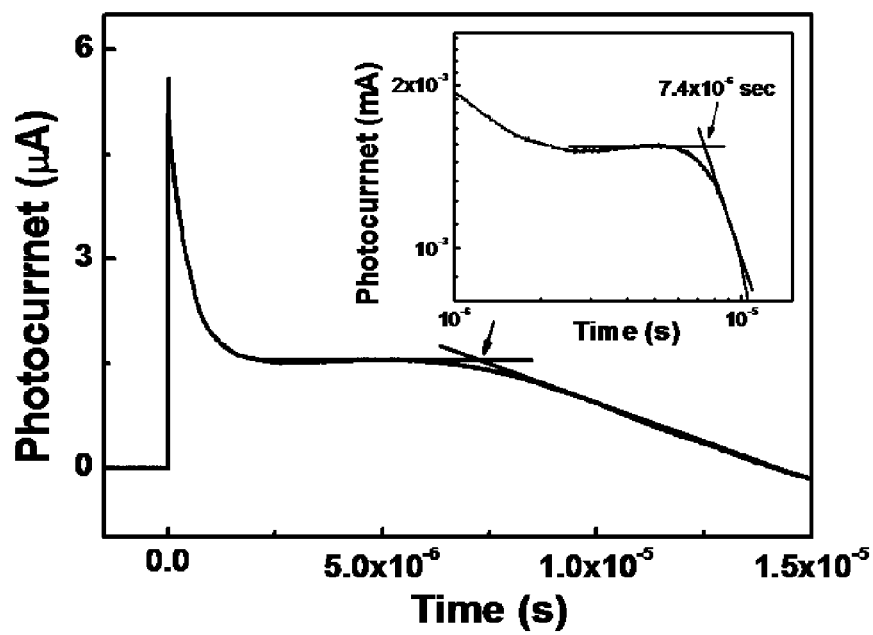
FIG. 4 is a graph illustrating time of flight (TOF) of titanium oxide.

FIG. 4 illustrates TOF measurements for the titanium oxide film. As shown in FIG. 4, TOF of an electron was measured at $7.4*10^{-5}$ seconds. Factoring in the 500 nm thickness of the titanium oxide film, the electron mobility was calculated to be $1.7*10^{-4}$ cm$^2$/Vs.

Furthermore, XRD of the titanium oxide film fabricated in the present invention was measured. A titanium oxide solution was spin coated on a rinsed glass substrate and XRD was measured.

Figure 5:
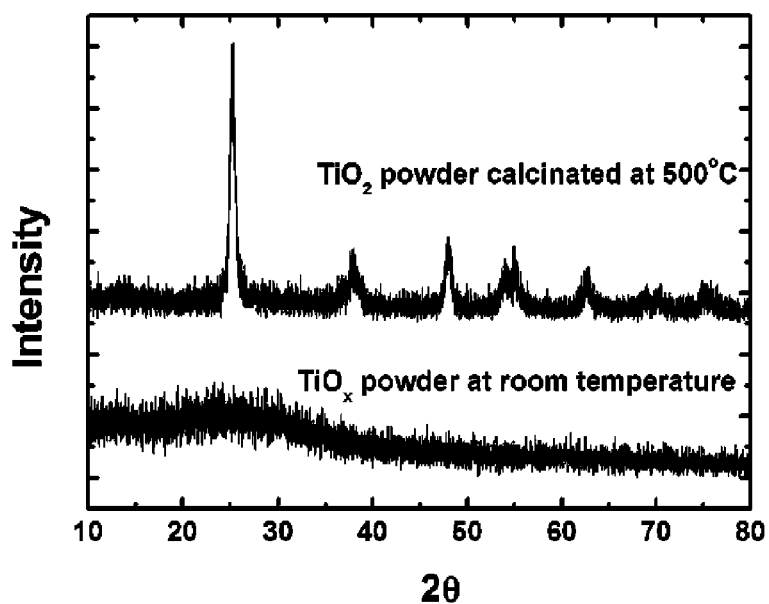
FIG. 5 is a graph illustrating an XRD measurement spectrum of titanium oxide.

FIG. 5 illustrates XRD spectra of a conventional titanium dioxide film that was thermally treated and a titanium oxide film of the present invention. Since the titanium dioxide film was thermally treated at a temperature of 500° C., it was observed that an anatase-type crystal was formed. In the titanium oxide film of the present invention, no structural peak was observed because the film has amorphous characteristics.

EXAMPLE 2

Fabrication of Polymer Light Emitting Diode Using Titanium Oxide Solution

The titanium oxide solution prepared in Example 1 was coated between a light emitting layer and a metal electrode to fabricate a polymer light emitting diode.

A substrate was cleaned using neutral detergent, immersed in a container of water, and cleaned using an ultrasonic cleaner for 10 minutes. Afterwards, the cleaning solution was changed to acetone and alcohol and the substrate was again cleaned in the same way using the ultrasonic cleaner for 10 minutes, respectively. The cleaned substrate was dried in an oven at a temperature of 100° C. for at least one hour to remove remaining alcohol and then UV-ozone treated.

A PEDOT:PSS solution was coated on the cleaned substrate and the substrate was spun at 5000 rpm for one minute to form a PEDOT:PSS layer. Then the substrate was placed on a hot plate at a temperature of 140° C. for 10 minutes to remove moisture from the PEDOT:PSS layer.

The substrate having the PEDOT:PSS layer was then placed in a glove box filled with nitrogen gas and spun at 2000 to 3000 rpm for one minute to form a light emitting layer. Then, the substrate was placed on the hot plate at a temperature of 80° C. for 30 minutes to remove a solvent from the light-emitting polymer.

Afterwards, the substrate was exposed to the air and a diluted titanium oxide solution was spin coated at 6000 rpm to form a thin film on the light emitting layer. Thermal treatment was performed on the formed thin film at a temperature of 80° C. for 10 minutes and aluminum for a negative electrode was vacuum deposited to form a light emitting diode.

Characteristics of the fabricated light emitting diode were evaluated in the glove box. Current-voltage-brightness characteristics were measured using a Keithley 236 SMU and a corrected silicon photodiode.

Figure 6:
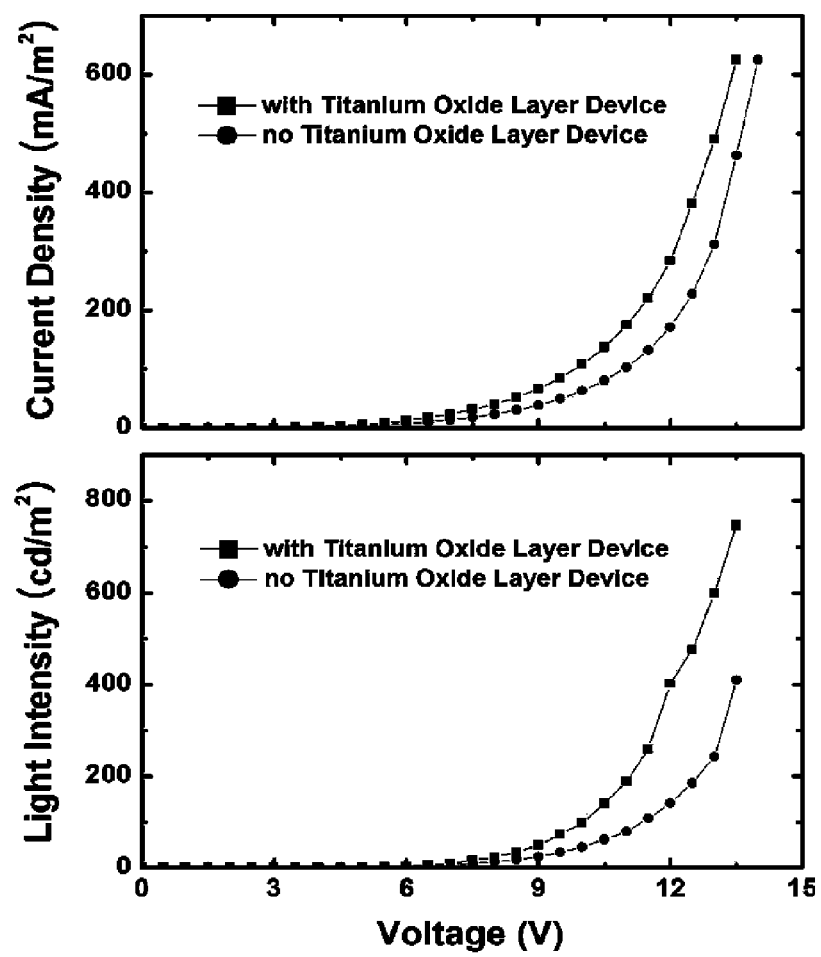
FIG. 6 is a graph illustrating current-voltage-brightness characteristics of a polymer light emitting diode according to whether titanium oxide is introduced.

FIG. 6 is a graph illustrating current-voltage-brightness characteristics of a light emitting diode according to whether titanium oxide is introduced.

Referring to FIG. 6, it was observed that the light emitting diode having titanium oxide exhibited a much higher current density. Also, the light emitting diode having titanium oxide showed increased brightness at the same voltage.

Figure 7:
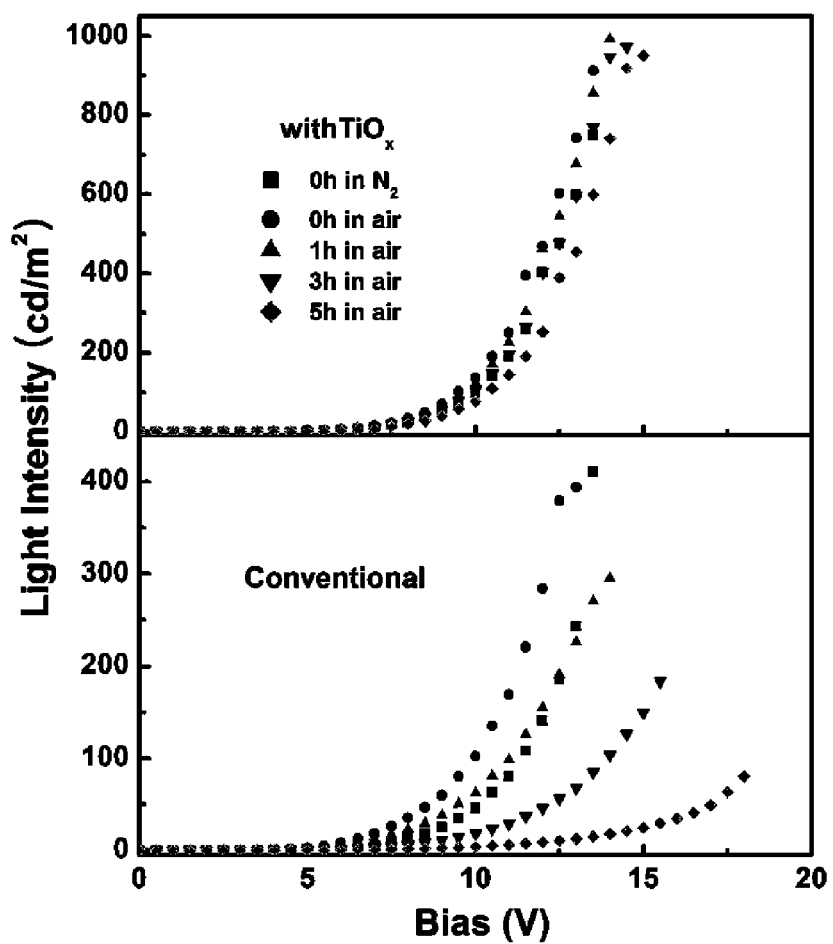
FIG. 7 is a graph illustrating voltage-brightness characteristics of a light emitting diode over time according to whether titanium oxide is introduced.
Figure 8:
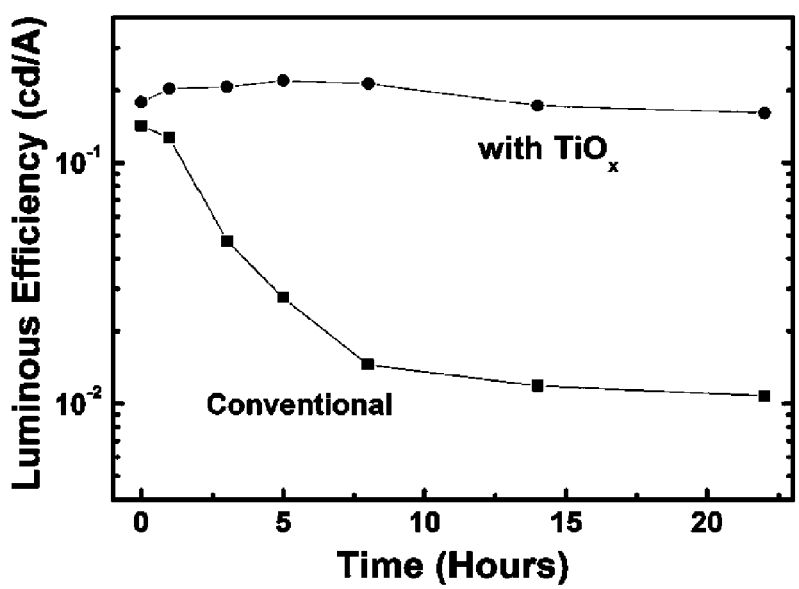
FIG. 8 is a graph illustrating change in efficiency of a polymer light emitting diode according to whether titanium oxide is introduced.

FIG. 7 is a curve illustrating voltage-brightness characteristics of a light emitting diode over time according to whether titanium oxide is introduced, and FIG. 8 illustrates a change in efficiency.

Referring to FIGS. 7 and 8, a device employing titanium oxide maintained constant efficiency without any difference in performance even after five hours. However, in the device that does not employ titanium oxide, it was observed that performance and efficiency drastically deteriorated over time. This shows that titanium oxide has a considerable effect on the performance and lifetime of the device.

EXAMPLE 3

Fabrication of Polymer Photovoltaic Cell Using Titanium Oxide Solution

In the present Example, a polymer photovoltaic cell was fabricated using the wet-processible titanium oxide solution of Example 1.

A substrate was cleaned using neutral detergent, ultrasonically cleaned in a container of water for 10 minutes, and then ultrasonically cleaned in acetone and alcohol for 10 minutes, respectively. The cleaned substrate was dried in an oven at a temperature of about 100° C. for at least one hour to remove alcohol remaining on the substrate. When all alcohol was completely removed, the substrate was irradiated with ultraviolet rays for one hour to form an ITO surface with hydrophilic properties.

A PEDOS:PSS solution was then coated on the substrate for a buffer layer and the substrate was spun at 5000 rpm for one minute to form a stack structure. Then, the substrate was placed on a hot plate at a temperature of 140° C. for 10 minutes to remove moisture from the PEDOS:PSS layer.

The substrate having the PEDOS:PSS layer was then moved into a glove box filled with nitrogen gas and a solution of P3HT mixed with $C_{60}$ at a weight ratio of 1:0.8 and dissolved in chloroform solvent was spun at 1000 to 1500 rpm for one minute to form a photoactive layer. The substrate was then placed on the hot plate at a temperature of 80° C. for 10 minutes to remove a solvent from the photoactive layer.

Afterwards, the substrate was exposed to air and a titanium oxide solution was spin-coated on the photoactive layer at 6000 rpm to form a thin film. After the thin film was formed, the substrate was thermally treated at a temperature of 80° C. for 10 minutes to turn the titanium oxide into gel.

Finally, aluminum for a negative electrode was vacuum deposited on the titanium oxide and the device was completed.

The photoactive layer may be formed by a different method than described above to maximize efficiency of the photovoltaic cell. For example, when a solution of the photoactive layer is formed using P3HT and $C_{60}$, the 1:0.8 ratio may be changed to 1:0.5, 1:0.6, 1:0.7, 1:0.9 or 1:1. Also, when the photoactive layer is formed by spin coating, its morphology can be adjusted by changing the solvent to chloroform, chlorobenzene, or dichlorobenzene, which has different evaporating velocities and boiling points.

After a metal cathode is deposited to complete the photovoltaic cell, crystalline and phase separation of the photoactive layer may be induced by thermal treatment. In the present Example, the photovoltaic cell was placed on the hot plate at a temperature of 150° C. for 10 minutes to induce P3HT crystallization and maximize performance. During the process, temperature and time of the thermal treatment may vary depending on device thickness and characteristics. For example, the thermal treatment may be performed at room temperature to 100° C., 100° C. to 150° C., or 160° C. to 200° C., and time may vary from several seconds to several hours.

Instead of P3HT polymer used in the present Example, a semiconductor polymer such as MDMO-PPV, MEH-PPV, or PCPDTBT may be used to fabricate a photovoltaic cell, and instead of $C_{60}$, its deviative, PCBM or PC BM, may be used.

Characteristics of the above-described photovoltaic cell were measured in the glove box. Under the conditions of AM 1.5G having a similar spectrum to sunlight, light intensity of 100 mW/cm$^2$ was radiated onto the device and current-voltage characteristics were measured using a Keithley 236 SMU.

Figure 9:
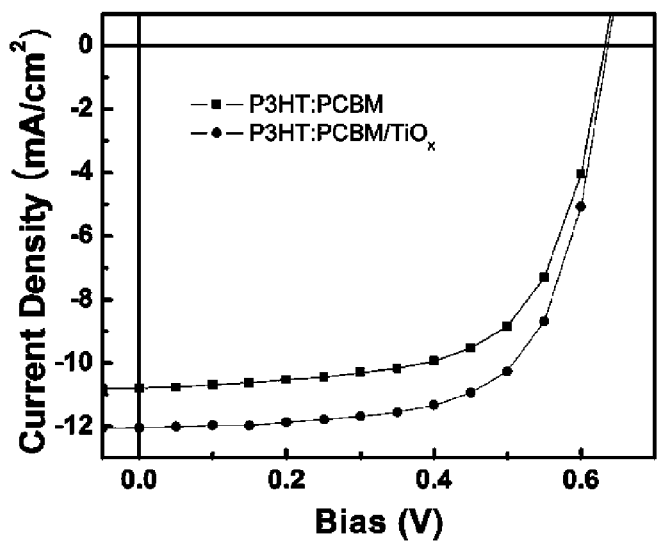
FIG. 9 is a graph illustrating current-voltage characteristics of a polymer photovoltaic cell according to whether titanium oxide is introduced.

FIG. 9 illustrates current-voltage characteristics of a photovoltaic cell employing titanium oxide and a photovoltaic cell not employing titanium oxide.

Referring to FIG. 9, the photovoltaic cell employing titanium oxide had a higher current density at the same voltage. That is, its performance was considerably enhanced compared to a conventional photovoltaic cell not employing titanium oxide.

Figure 10:
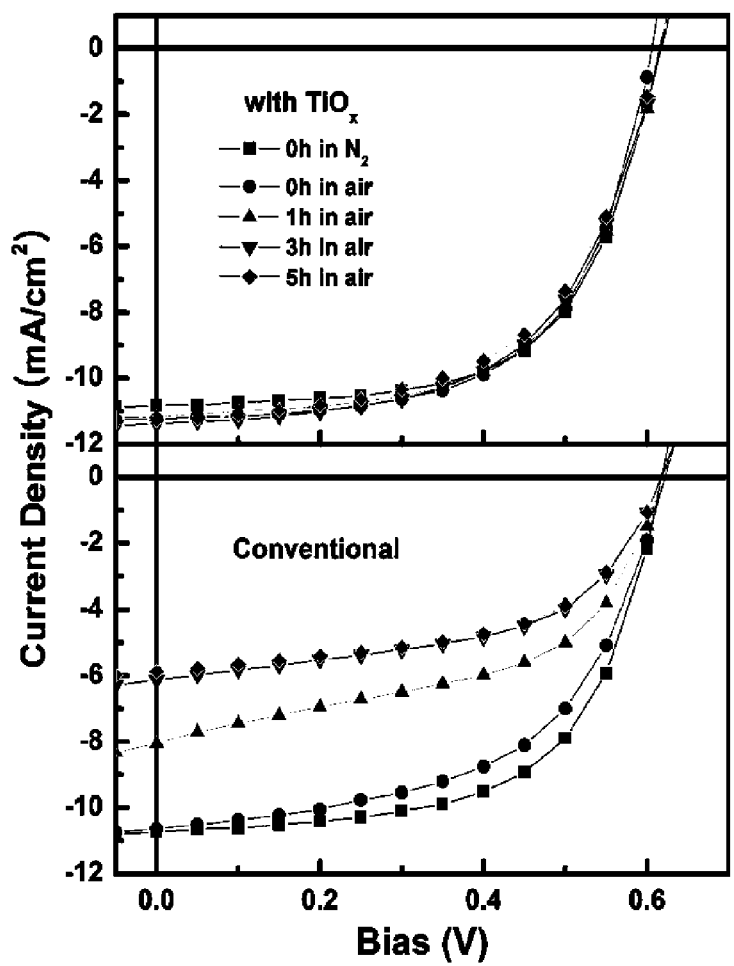
FIG. 10 is a graph illustrating current-voltage characteristics of a polymer photovoltaic cell over time according to whether titanium oxide is introduced.

Also, FIG. 10 is a graph illustrating current-voltage characteristics of a photovoltaic cell over time according to whether titanium oxide is introduced.

Referring to FIG. 10, the photovoltaic cell employing titanium oxide showed little change in performance even after five (5) hours. This shows that titanium oxide has a considerable effect on the performance of the photovoltaic cell. In contrast, performance of the photovoltaic cell without titanium oxide drastically deteriorated over time.

Figure 11:
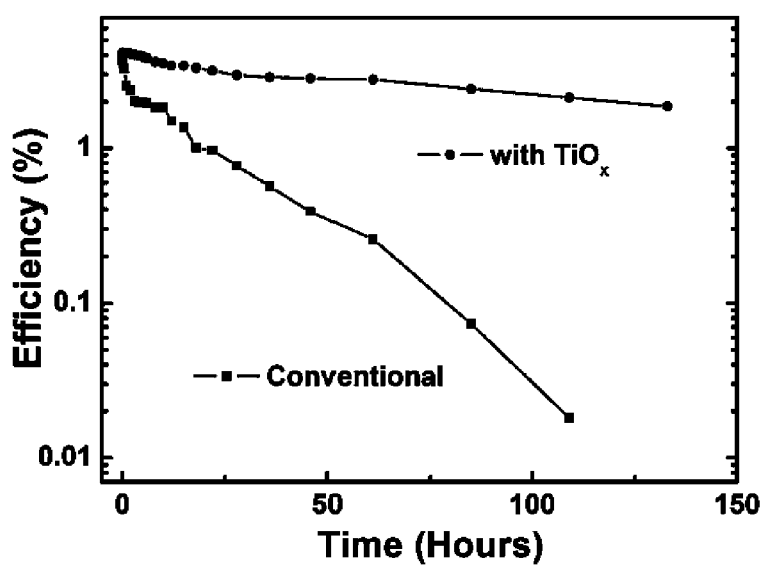
FIG. 11 is a graph illustrating change in efficiency of a polymer photovoltaic cell according to whether titanium oxide is introduced.

FIG. 11 is a graph illustrating change in efficiency of a photovoltaic cell over time.

Referring to FIG. 11, a photovoltaic cell to which titanium oxide is applied showed little change in efficiency over time. However, a photovoltaic cell to which titanium oxide is not applied showed drastic deterioration in efficiency over time. That is, when the titanium oxide film was applied to the photovoltaic cell, the lifetime of a polymer photovoltaic cell was considerably enhanced.

EXAMPLE 4

Formation of Multilayer Film Including Titanium Oxide

In the present Example, a single multilayer film was formed of two films with different surface characteristics using the titanium oxide solution of Example 1.

Different types of polymer films have different surface characteristics such as hydrophilic properties, hydrophobic properties, etc. Such different surface characteristics make it difficult to form a film having hydrophobic properties on a film having the hydrophilic properties or to sequentially introduce a material having hydrophilic properties and a material of hydrophobic properties into a film to form a multilayer structure using a wet process. Furthermore, even if a film is fabricated to have a multilayer structure through a wet process using two materials having the same characteristics, the two materials may be dissolved by the same solvent. Therefore, when the wet process is performed, since the first material coat can be dissolved by a solvent of the second material coat, a multilayer structure cannot be formed. Therefore, problems caused by a solvent do not enable simultaneous formation of a multilayer using two or more materials having the same characteristics.

To overcome these problems, a polymer film is formed, the titanium oxide solution of the present invention is introduced, and then a second polymer solution is coated thereon, so that a multilayer film may be fabricated.

PEDOT:PSS having hydrophilic properties was coated on a cleaned substrate at 3000 rpm for one minute and the substrate was placed on a hot plate at a temperature of 150° C. to remove a solvent. After the solvent was removed, a titanium oxide solution was spin-coated on the substrate at 3000 rpm for one minute and the substrate was placed on the hot plate to remove the solvent so that a film was formed. Next, a P3HT:PCBM solution was spin-coated at 3000 rpm on the titanium oxide and the solvent was removed using the hot plate so that a multilayer film was formed.

Similar to the above-described method, after a P3HT:PCBM mixed solution having hydrophobic properties was spin-coated on a cleaned substrate at 3000 rpm for one minute, the substrate was placed on the hot plate at a temperature of 150° C. to remove a solvent. Afterwards, a titanium oxide solution was spin-coated at 5000 rpm for one minute and the solvent was removed using the hot plate so that a film was formed.

Next, a PEDOT:PSS solution having hydrophilic properties was coated on the titanium oxide and the solvent was removed using the hot plate so that a multilayer film was formed.

Figure 12:
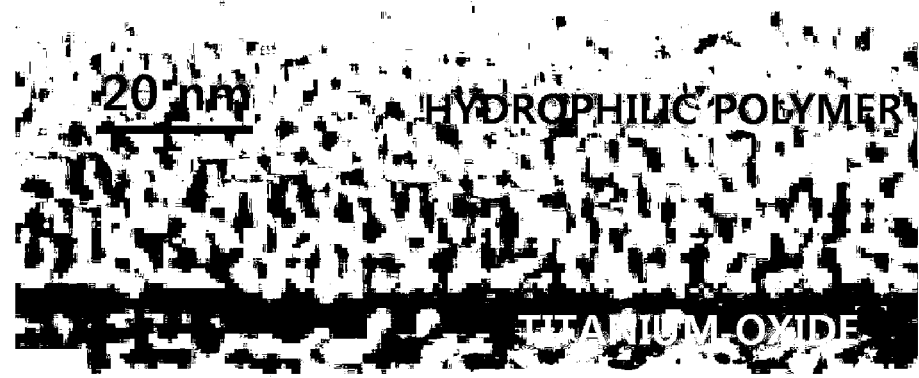
FIG. 12 is a TEM image of a film having a multilayer structure into which titanium oxide has been introduced.

FIG. 12 is an TEM image of a multilayer structure of P3HT:PCBM/titanium oxide/PEDOT:PSS fabricated in the present Example.

Referring to FIG. 12, introduction of P3HT:PCBM and PEDOT:PSS having different characteristics did not damage the formed film.

Example Embodiment 2

The metal oxide solution of Example 1 may be doped with a group V-element as a donor to prepare an n-type metal oxide solution.

For example, the n-type metal oxide solution may be prepared by removing moisture and oxygen using the tools disclosed in FIG. 1. For example, in the process of preparing the titanium oxide intermediate solution of Example 1, niobium ethoxide may be introduced. When the intermediate solution is formed, the titanium oxide intermediate solution has n-type electrical characteristics due to the introduction of group V niobium.

In the present example embodiment, 1 to 6 mol % of n-type niobium ethoxide donor compound was injected into titanium isoproxide to perform n-type solution doping. Temperature conditions and type and amount of a solvent, an additive, and a dispersion solution were set the same as in Example 1. While donor concentration in the titanium oxide solution formed in Example 1 was $5.59*10^{17}/cm^3$, when niobium ethoxide was injected to titanium isoproxide and ethanolamine, which were injected the same as in Example 1, donor concentration was very high. That is, when 1 mol % of niobium ethoxide was introduced to titanium isoproxide, donor concentration was $1.18*10^{18}/cm^3$.

Thus, it was concluded that the titanium oxide solution doped with the n-type solution has high electron mobility, can be easily applied to a light emitting diode, a photovoltaic cell, etc., has high performance and is easily processible.

Figure 13:
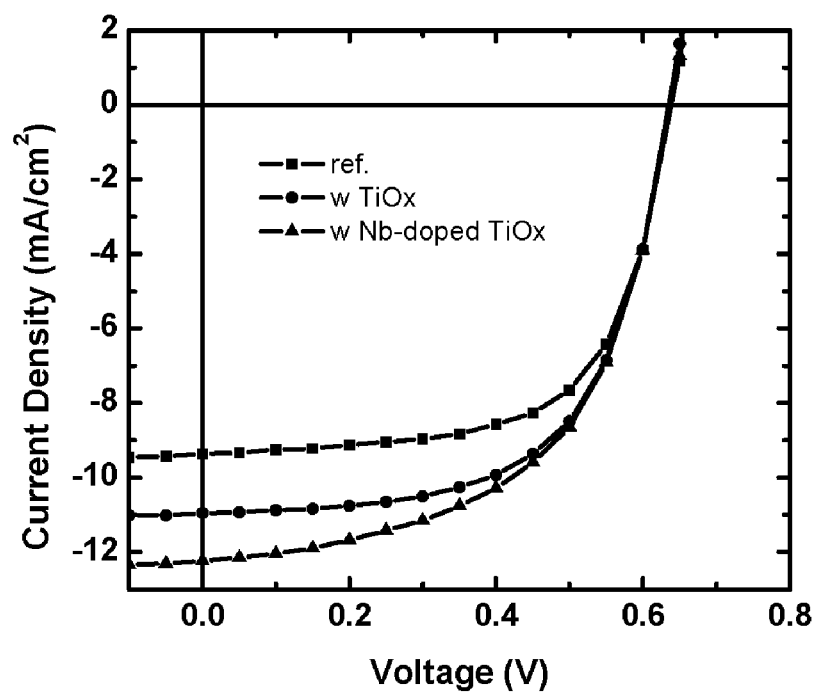
FIG. 13 is a graph illustrating voltage-current characteristics of a photovoltaic cell to which a titanium oxide doped with an n-type solution is applied.

FIG. 13 is a graph illustrating voltage-current characteristics of a photovoltaic cell to which a titanium oxide solution doped with an n-type donor is applied.

The photovoltaic cell illustrated in FIG. 13 has the same characteristics as disclosed in Example 3, the only difference being that the titanium oxide solution of Example 1 contains titanium isoproxide doped with 1 mol % of n-type niobium ethoxide. Also, the photovoltaic cell of Example 3 formed using the titanium oxide solution that is not doped is illustrated for comparison.

Referring to FIG. 13, current density at the same voltage increased when niobium was applied. That is, application of the n-type doped titanium oxide enhanced the current drivability of the photovoltaic cell under the same voltage.

In the present example embodiment, the n-type dopant is not limited to niobium. That is, any group V element such as V or Ta may be used. If V or Ta are used, they are applied as vanadium ethoxide or tantalum ethoxide.

In the present invention, a metal oxide solution is formed by introducing a solvent and an additive. The metal oxide dispersion solution is exposed to oxygen or moisture in a subsequent doping process so that a hydrolysis reaction occurs. Therefore, a solution process can be performed and amphiphilic characteristics facilitate application to a stack structure having different characteristics.

While the invention has been shown and described with reference to certain example embodiments thereof, it will be understood by those skilled in the art that various changes in form and details may be made therein without departing from the spirit and scope of the invention as defined by the appended claims.

The invention claimed is:

1. A method of preparing a metal oxide solution, comprising:
   introducing a solvent and an additive to a metal alkoxide, and forming a metal oxide intermediate solution, wherein the metal alkoxide is set to have a volume ratio of 5% to 60% with respect to the solvent, and the additive is set to have a volume ratio of 5% to 20% with respect to the solvent;
   applying heat to the metal oxide intermediate solution, concentrating the metal oxide intermediate solution, and forming a gelatinous metal oxide; and
   mixing the gelatinous metal oxide with a dispersion solution, and forming a metal oxide solution, wherein the forming of the metal oxide intermediate solution, the forming of the gelatinous metal oxide, and the forming of the metal oxide solution are performed in a state where oxygen and moisture are removed.

2. The method of claim 1, wherein the metal alkoxide includes Ti, Zn, Sr, In, Ba, K, Nb, Fe, Ta, W, Bi, Ni, Cu, Mo, Ce, Pt, Ag, Rh, Ru, or a mixture thereof.

3. The method of claim 1, wherein the solvent includes alcohol and the additive includes alcohol-amine, hydrogen peroxide or ammonium hydroxide.

4. The method of claim 1, wherein the heat is applied at a temperature of 60° C. to 180° C. during concentration.

5. The method of claim 1, wherein the dispersion solution includes alcohol, chloroform, chlorobenzene, dichlorobenzene, tetrahydrofuran (THF), xylene, DMF, DMSO, or toluene.

6. The method of claim 1, wherein the forming of the metal oxide intermediate solution includes introducing a donor compound into the metal alkoxide in addition to the solvent and the additive, so that n-type solution doping is performed.

7. The method of claim 6, wherein the donor compound includes V, Nb or Ta.

8. The method of claim 7, wherein the donor compound is added to the metal alkoxide at a ratio of 1 to 6 mol %.

9. A metal oxide solution prepared by a process according to claim 1.

10. The metal oxide solution of claim 9, wherein the metal alkoxide includes Ti, Zn, Sr, In, Ba, K, Nb, Fe, Ta, W, Bi, Ni, Cu, Mo, Ce, Pt, Ag, Rh, Ru, or a mixture thereof.

11. The metal oxide solution of claim 9, wherein the solvent includes alcohol and the additive includes alcohol-amine, hydrogen peroxide or ammonium hydroxide.

12. The metal oxide solution of claim 11, wherein the metal alkoxide includes titanium isoproxide and the additive includes ethanolamine.

13. The metal oxide solution of claim 9, wherein the gelatinous metal oxide is the combination of the metal alkoxide and the additive.

14. The metal oxide solution of claim 9, wherein the dispersion solution includes alcohol, chloroform, chlorobenzene, dichlorobenzene, tetrahydrofuran (THF), xylene, DMF, DMSO, or toluene.

15. An organic photovoltaic cell comprising:
   a substrate having a positive electrode;
   a photoactive layer formed on the substrate;
   a metal oxide formed on the photoactive layer; and
   a negative electrode formed on the metal oxide,
   wherein the metal oxide is formed by coating and drying a metal oxide solution prepared by a process according to claim 1.

16. The organic photovoltaic cell of claim 15, wherein the metal alkoxide includes Ti, Zn, Sr, In, Ba, K, Nb, Fe, Ta, W, Bi, Ni, Cu, Mo, Ce, Pt, Ag, Rh, Ru, or a mixture thereof.

17. The organic photovoltaic cell of claim 15, wherein the metal oxide solution has n-type electrical property due to introduction of a donor compound in addition to the solvent and the additive.

18. The organic photovoltaic cell of claim 17, wherein the donor compound includes V, Nb or Ta.

* * * * *